(12) United States Patent
Kim et al.

(10) Patent No.: US 7,719,352 B2
(45) Date of Patent: May 18, 2010

(54) ACTIVE CIRCUITS WITH ISOLATION SWITCHES

(75) Inventors: Tae Wook Kim, Austin, TX (US); Kenneth Charles Barnett, Austin, TX (US); Harish Muthali, Round Rock, TX (US)

(73) Assignee: QUALCOMM Incorporated, San Diego, CA (US)

( * ) Notice: Subject to any disclaimer, the term of this patent is extended or adjusted under 35 U.S.C. 154(b) by 175 days.

(21) Appl. No.: 11/832,581

(22) Filed: Aug. 1, 2007

(65) Prior Publication Data

US 2008/0224770 A1   Sep. 18, 2008

Related U.S. Application Data

(60) Provisional application No. 60/909,407, filed on Mar. 30, 2007, provisional application No. 60/894,492, filed on Mar. 13, 2007.

(51) Int. Cl.
*H03F 1/14* (2006.01)

(52) U.S. Cl. .................. 330/51; 330/124 R; 330/307; 330/295

(58) Field of Classification Search .................. 330/51, 330/124 R, 307, 295
See application file for complete search history.

(56) References Cited

U.S. PATENT DOCUMENTS

| | | | | |
|---|---|---|---|---|
| 4,965,530 | A * | 10/1990 | Katz | 330/295 |
| 7,023,272 | B2 | 4/2006 | Hung et al. | |
| 7,132,844 | B2 * | 11/2006 | Hashimoto | 324/765 |
| 7,142,042 | B1 * | 11/2006 | Henry | 327/538 |
| 7,161,423 | B2 * | 1/2007 | Paul et al. | 330/51 |
| 7,167,044 | B2 | 1/2007 | Li et al. | |
| 7,362,171 | B2 * | 4/2008 | Kunihiro | 330/126 |
| 2005/0248402 | A1 | 11/2005 | Zhenbiao et al. | |

OTHER PUBLICATIONS

Naveed Ahsan et al: "Dual Band Tunable LNA for Flexible RF Front End" Applied Sciences&Technology. 2007. IBCAST 2007. International Bhur Ban Conference on, IEEE, PI (Jan. 1, 2007), pp. 19-22.
Moreira C P et al: "A Reconfigurable DCS1800/W-CDMA LNA: Design and Implementation Issues" Microwave Conference, 2006. 36th European, IEEE, PI, (Sep. 1, 2006), pp. 1652-1655.
International Search Report-PCT/US08/056696, International Search Authority-European Patent Office-Aug. 25, 2008.
Written Opinion-PCT/US08/056696, International Search Authority-European Patent Office-Aug. 25, 2008.
International Preliminary Report on Patentability - PCT/US08/056696 - European Patent Office - Munich - Jun. 22, 2009.

* cited by examiner

*Primary Examiner*—Patricia Nguyen
(74) *Attorney, Agent, or Firm*—Jiayu Xu (57) ABSTRACT

Active circuits with isolation switches are described. In one design, an apparatus includes first and second amplifiers coupled in parallel. Each amplifier receives an input signal and provides an output signal. Each amplifier has a switch that isolates the amplifier when the amplifier is turned off. The first and second amplifiers may be high and low gain amplifiers or two low noise amplifiers (LNAs). The first and second amplifiers may be for different communication systems, different frequency bands, and/or different gain ranges. In general, any number of amplifiers may be coupled in parallel, and each amplifier may have a switch to isolate that amplifier when turned off. A switch for an amplifier may be a shunt switch coupled between an internal node of the amplifier and ground. The shunt switch may be closed when the amplifier is turned off and may be opened when the amplifier is turned on.

35 Claims, 9 Drawing Sheets

ACTIVE CIRCUITS WITH ISOLATION SWITCHES

CLAIM OF PRIORITY UNDER 35 U.S.C. §119

The present Application for Patent claims priority to Provisional Application Ser. No. 60/894,492, entitled "ISOLATION SWITCH FOR MULTI-BAND/MULTI-MODE/MULTI-GAIN MODE RF CIRCUIT OPERATION," filed Mar. 13, 2007, and Ser. No. 60/909,407, entitled "ISOLATION SWITCH FOR MULTI-BAND/MULTI-MODE/MULTI-GAIN MODE RF CIRCUIT OPERATION," filed Mar. 30, 2007, both assigned to the assignee hereof, and expressly incorporated herein by reference.

BACKGROUND

I. Field

The present disclosure relates generally to circuits, and more specifically to active circuits such as amplifiers.

II. Background

A modern communication receiver may support operation in multiple modes, on multiple frequency bands, etc. The multiple modes may be for different communication systems that may have different signal characteristics and requirements. In order to support multi-mode and/or multi-band operation, the receiver may have multiple radio frequency (RF) paths. Each RF path may be designed for one or more frequency bands in one or more modes. An appropriate RF path may be selected for use depending on the frequency band and mode being received. Typically, only one of the RF paths may be enabled at any given moment, and the remaining RF paths may be disabled. It is desirable to achieve good performance for the enabled RF path with as little degradation from the disabled RF paths as possible.

SUMMARY

Active circuits with isolation switches and suitable for use in multiple signal paths are described herein. An active circuit is a circuit having at least one active circuit component such as transistor. An active circuit may comprise an amplifier, a mixer, a buffer, an active filter, etc. An isolation switch is a switch that may be activated (e.g., opened or closed depending on the switch configuration) to improve isolation of an active circuit when the active circuit is turned off. The isolation switch may result in less leakage signal flowing through the active circuit when the active circuit is turned off.

In one design, an apparatus may include first and second amplifiers coupled in parallel, e.g., connected at their inputs and/or their outputs. The first amplifier may receive a first input signal and provide a first output signal. The second amplifier may receive a second input signal and provide a second output signal. The first amplifier may have a first switch configured to isolate the first amplifier when this amplifier is turned off. The second amplifier may have a second switch configured to isolate the second amplifier when this amplifier is turned off. In one design, the first amplifier may be a high gain amplifier and the second amplifier may be a low gain amplifier. In another design, the first and second amplifiers may be low noise amplifiers (LNAs) in a receiver. The first and second amplifiers may be for different communication systems, different frequency bands, and/or different gain ranges.

The apparatus may further include a third amplifier coupled in parallel with the first and/or second amplifier. The third amplifier may receive a third input signal and provide a third output signal. The third amplifier may have a third switch configured to isolate the third amplifier when this amplifier is turned off. In general, any number of amplifiers may be coupled in parallel, and each amplifier may have a switch to isolate the amplifier when it is turned off.

A switch for an amplifier may comprise a shunt switch coupled between an internal node of the amplifier and alternating current (AC) ground, which may be circuit ground or a supply voltage. The shunt switch may be closed when the amplifier is turned off and may be opened when the amplifier is turned on. Alternatively or additionally, the switch for the amplifier may comprise a series switch that is inserted at an internal node of the amplifier.

Various aspects and features of the disclosure are described in further detail below.

DETAILED DESCRIPTION

The active circuits with isolation switches described herein may be used for various electronics devices such as broadcast receivers, cellular phones, personal digital assistants (PDAs), handheld devices, wireless modems, laptop computers, cordless phones, consumer electronics devices, etc. These active circuits may also be used for various communication systems such as Code Division Multiple Access (CDMA) systems, Time Division Multiple Access (TDMA) systems, Frequency Division Multiple Access (FDMA) systems, Orthogonal FDMA (OFDMA) systems, Single-Carrier FDMA (SC-FDMA) systems, wireless local area networks (WLANs), broadcast systems, satellite positioning systems, etc.

For clarity, the use of active circuits with isolation switches in a broadcast receiver is described below. The broadcast receiver may support MediaFLO™, Digital Video Broadcasting for Handhelds (DVB-H), Integrated Services Digital Broadcasting for Terrestrial Television Broadcasting (ISDB-T), and/or other terrestrial broadcast systems. MediaFLO™, DVB-H, and ISDB-T may be considered as different modes. A MediaFLO™ system may operate with a 6 megaHertz (MHz) bandwidth in a frequency range of 698 to 746 MHz. A DVB-H system may operate with a 5, 6, 7 or 8 MHz bandwidth in a frequency range of 470 to 860 MHz. An ISDB-T system may operate with a 6 MHz bandwidth in a frequency range of 470 to 770 MHz. MediaFLO™ is described in a document TIA-1099, entitled "Forward Link Only Air Interface Specification for Terrestrial Mobile Multimedia Multicast," dated August 2006. DVB-H is described in a document ETSI EN 300 744, entitled "Digital Video Broadcasting (DVB); Framing Structure, Channel Coding and Modulation for Digital Terrestrial Television," dated November 2004 January 2001. ISDB-T is described in a document ARIB STD-B31, entitled "Transmission System for Digital Terrestrial Television Broadcasting," dated July 2003. These documents are publicly available.

Figure 1:
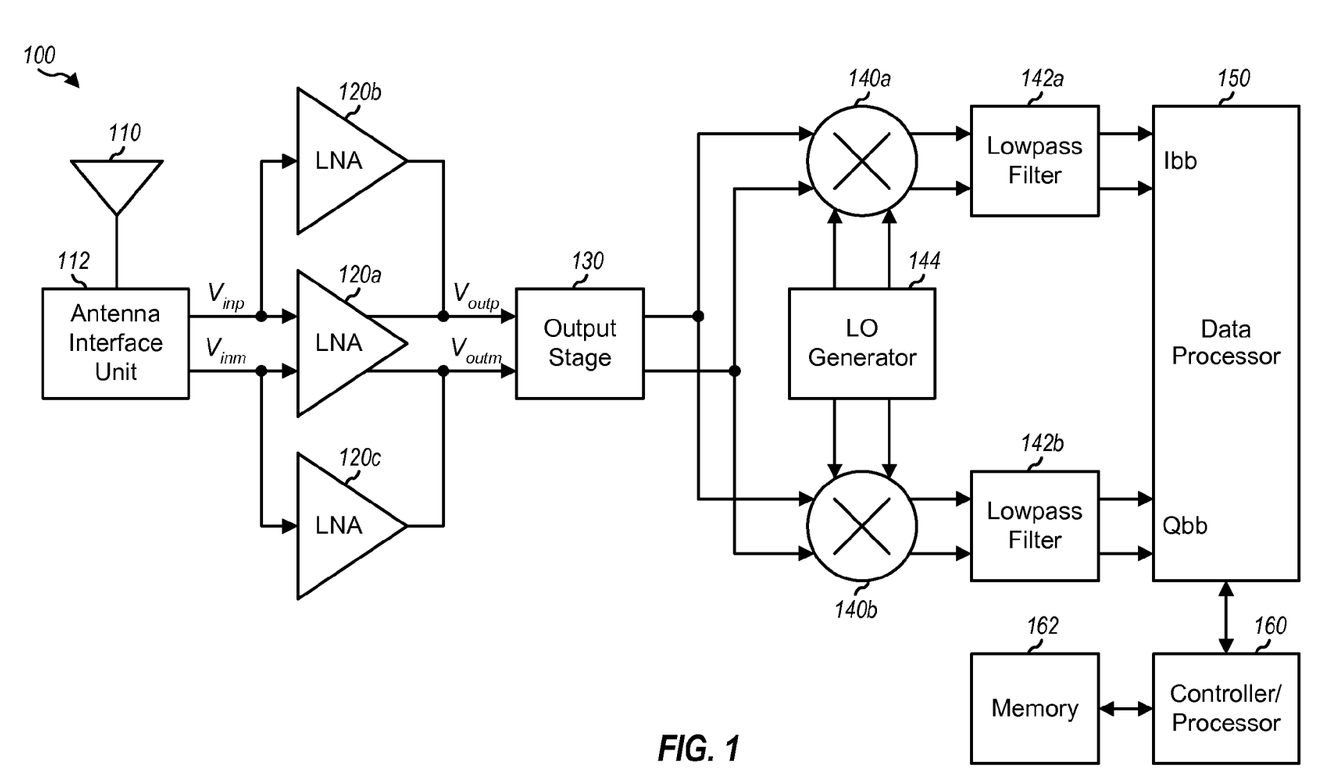
FIG. 1 shows a block diagram of a receiver.

FIG. 1 shows a block diagram of a design of a broadcast receiver 100. In this design, broadcast receiver 100 includes three LNAs 120a, 120b and 120c that may be used for multiple frequency bands and multiple modes. In one design, LNA 120a supports DVB-H and/or ISDB-T, LNA 120b supports high band MediaFLO™ from 719 to 746 MHz, and LNA 120c supports low band MediaFLO™ from 698 to 719 MHz. In general, a receiver may include any number of LNAs for any number of frequency bands and any number of modes. Each LNA may support one or more modes and one or more frequency bands.

A receiver may be implemented with a super-heterodyne architecture or a direct-conversion architecture. In the super-heterodyne architecture, a received signal is downconverted from RF to baseband in multiple stages, e.g., from RF to an intermediate frequency (IF) in one stage, and then from IF to baseband in another stage. In the direct-conversion architecture, which is also referred to as a zero-IF architecture, a received signal is downconverted from RF to baseband in one stage. The super-heterodyne and direct-conversion architectures may use different circuit blocks and/or have different requirements. The following description assumes that broadcast receiver 100 implements the direct-conversion architecture.

In broadcast receiver 100, an antenna 110 receives broadcast signals from broadcast stations and provides a received signal to an antenna interface unit 112. Unit 112 may include one or more switches, filters, baluns, etc. Each filter may pass signal components in a designated frequency range and may be implemented with a surface acoustic wave (SAW) filter, a ceramic filter, or some other type of filter. If multiple filters are present within unit 112, then one of the filters may be selected for use, and a switch may couple antenna 110 to the selected filter. A balun may be used for single-ended to differential conversion, impedance transformation, etc.

In the design shown in FIG. 1, LNA 120a is a differential amplifier whereas LNAs 120b and 120c are single-ended amplifiers. In general, the choice of single-ended or differential design for each LNA may be made based on system requirements and/or other considerations such as design complexity, power consumption, cost, etc. When a DVB-H or ISDB-T mode is selected, unit 112 may process the received signal and provide a differential LNA input signal on lines $V_{inp}$ and $V_{inm}$. LNA 120a may then amplify the differential LNA input signal and provide a differential LNA output signal on lines $V_{outp}$ and $V_{outm}$. When a high band MediaFLO™ mode is selected, unit 112 may process the received signal and provide a single-ended LNA input signal on line $V_{inp}$. LNA 120b may then amplify the LNA input signal and provide an LNA output signal on line $V_{outp}$. When a low band MediaFLO™ mode is selected, unit 112 may process the received signal and provide a single-ended LNA input signal on line $V_{inm}$. LNA 120c may then amplify the LNA input signal and provide an LNA output signal on line $V_{outm}$.

An output stage 130 may receive the LNA output signal on line $V_{outp}$ and/or line $V_{outm}$ and may provide a differential conditioned signal to mixers 140a and 140b. Output stage 130 may include a balun for single-ended to differential conversion and one or more programmable attenuators, buffers, amplifiers, etc. Mixer 140a may downconvert the conditioned signal with an inphase (I) local oscillator (LO) signal from an LO generator 144 and provide an I downconverted signal. A lowpass filter 142a may filter the I downconverted signal and provide an I baseband signal (Ibb) to a data processor 150. Similarly, mixer 140b may downconvert the conditioned signal from output stage 130 with a quadrature (Q) LO signal from LO generator 144 and provide a Q downconverted signal. A lowpass filter 142b may filter the Q downconverted signal and provide a Q baseband signal (Qbb) to data processor 150.

LO generator 144 may generate the I and Q LO signals for mixers 140a and 140b, respectively. LO generator 144 may include one or more voltage controlled oscillators (VCOs), phase locked loops (PLLs), reference oscillators, etc.

FIG. 1 shows an example receiver design. In general, the conditioning of the signals in a receiver may be performed by one or more stages of amplifier, filter, mixer, etc. These circuit blocks may be arranged differently from the configuration shown in FIG. 1. Furthermore, other circuit blocks not shown in FIG. 1 may be used to condition the signals in the receiver. All or a portion of the receiver may be implemented on one or more RF integrated circuits (RFICs), mixed-signal ICs, etc. For example, LNAs 120a, 120b and 120c and the subsequent analog circuits in broadcast receiver 100 may be implemented in a Universal Broadcast Modem (UBM) chip.

Data processor 150 may include various processing units for data reception and other functions. For example, data processor 150 may include a digital signal processor (DSP), a reduced instruction set computer (RISC) processor, a central processing unit (CPU), etc. A controller/processor 160 may control the operation at broadcast receiver 100. Memory 162 may store program codes and data for broadcast receiver 100. Data processor 150, controller/processor 160, and/or memory 162 may be implemented on one or more application specific integrated circuits (ASICs) and/or other ICs.

In the design shown in FIG. 1, broadcast receiver 100 has three RF paths via three LNAs 120a, 120b and 120c for multiple modes and multiple frequency bands. One of the LNAs may be selected for use at any given moment, and the other two LNAs may be turned off. Since the three LNAs are coupled in parallel, there may be a leakage path through each LNA that is turned off. The leakage paths may degrade performance.

Figure 2A:
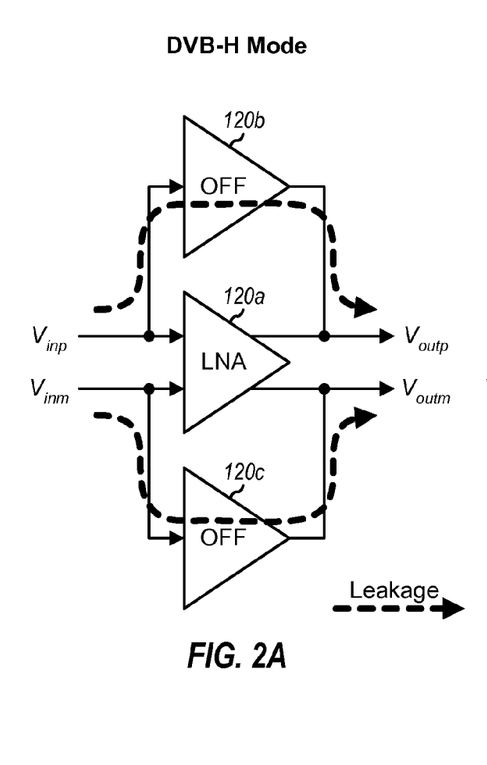
FIGS. 2A to 2C show three LNA configurations for the receiver in FIG. 1.

FIG. 2A shows an LNA configuration for the DVB-H mode. In this mode, LNA 120a is turned on, and LNAs 120b and 120c are turned off. LNA 120a amplifies a differential LNA input signal on lines $V_{inp}$ and $V_{inm}$ and provides a differential LNA output signal on lines $V_{outp}$ and $V_{outm}$. LNA 120b may provide a leakage path, and some of the signal from line $V_{inp}$ may leak onto line $V_{outp}$. LNA 120c may also provide a leakage path, and some of the signal from line $V_{inm}$ may leak onto line $V_{outm}$.

Figure 2B:
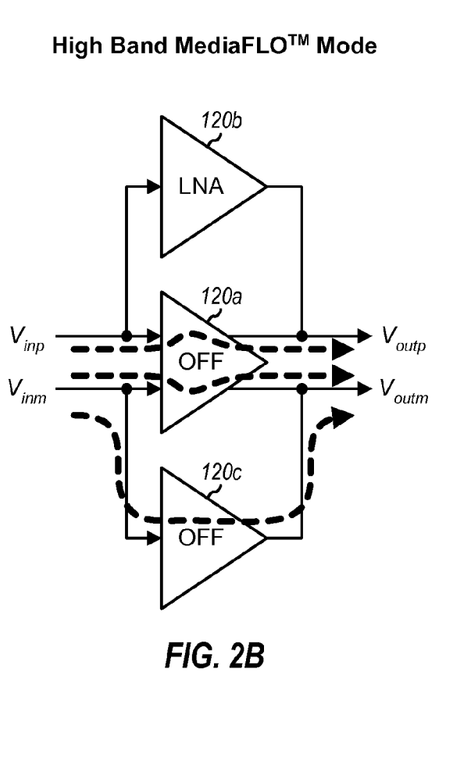

FIG. 2B shows an LNA configuration for the high band MediaFLO™ mode. In this mode, LNA 120b is turned on, and LNAs 120a and 120c are turned off. LNA 120b amplifies an LNA input signal on line $V_{inp}$ and provides an LNA output signal on line $V_{outp}$. LNA 120a may provide leakage paths, and some of the signals from lines $V_{inp}$ and $V_{inm}$ may leak onto lines $V_{outp}$ and $V_{outm}$. LNA 120c may also provide a leakage path, and some of the signal from line $V_{inm}$ may leak onto line $V_{outm}$.

Figure 2C:
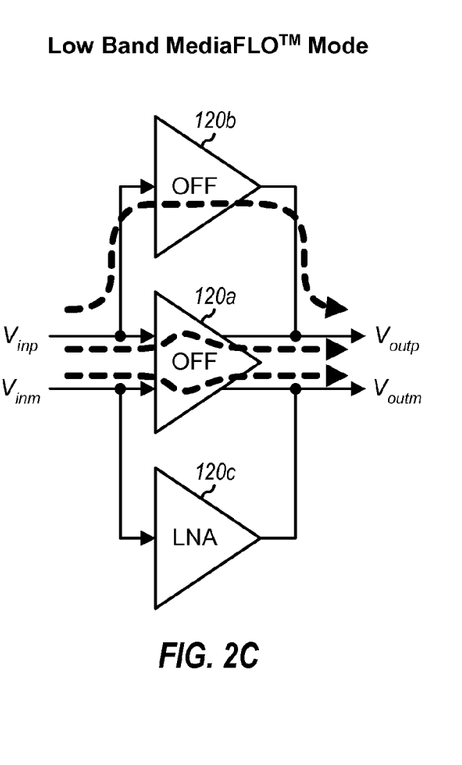

FIG. 2C shows an LNA configuration for the low band MediaFLO™ mode. In this mode, LNA 120c is turned on, and LNAs 120a and 120b are turned off. LNA 120c amplifies an LNA input signal on line $V_{inm}$ and provides an LNA output signal on line $V_{outm}$. LNA 120a may provide leakage paths, and some of the signals from lines $V_{inp}$ and $V_{inm}$ may leak onto lines $V_{outp}$ and $V_{outm}$. LNA 120b may also provide a leakage path, and some of the signal from line $V_{inp}$ may leak onto line $V_{outp}$.

In each of the LNA configurations shown in FIGS. 2A through 2C, leakage signals from the LNAs that are turned off may act as interference that may degrade receiver performance. A broadcast signal being received (e.g., for DVB-H) may be small relative to broadcast signals not being received (e.g., for high band and low band MediaFLO™). Hence, even though the leakage paths may be attenuated relative to the LNA that is turned on, the leakage signals may be relatively large in comparison to the desired signal and may adversely impact receiver performance.

Figure 3A:
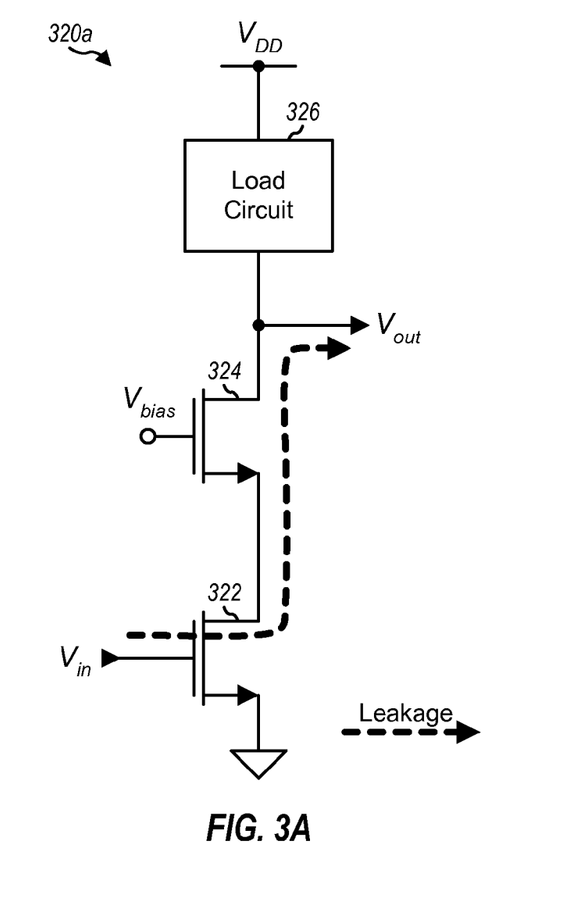
FIGS. 3A and 3B show LNAs without and with feedback, respectively.

FIG. 3A shows a schematic diagram of an LNA 320a, which may be used for any one of LNAs 120a through 120c in FIG. 1. Within LNA 320a, an N-channel field effect transistor (N-FET) 322 has its source coupled to circuit ground, its gate receiving an input signal $V_{in}$, and its drain coupled to the source of an N-FET 324. The input signal may be from line $V_{inp}$ or $V_{inm}$ in FIG. 1. N-FET 324 has its gate receiving a bias voltage $V_{bias}$ and its drain providing an output signal $V_{out}$. The output signal may be for line $V_{outp}$ or $V_{outm}$ in FIG. 1. A load circuit 326 is coupled between the drain of N-FET 324 and a power supply voltage $V_{DD}$.

N-FET 322 provides signal amplification for the input signal $V_{in}$. N-FET 324 provides load isolation for N-FET 322 and drives load circuit 326. Load circuit 326 provides a load for N-FET 324 and may perform other functions such as output impedance matching. Load circuit 326 may include one or more resistors, inductors, capacitors, transistors, etc.

LNA 320a may be turned off by providing a bias voltage of 0V or some other low voltage to the gate of N-FET 322 and/or 324. The low bias voltage may turn off N-FET 322 and/or 324. However, there may be a leakage path through a parasitic gate-to-drain capacitance $C_{gd}$ of N-FET 322 and a parasitic source-to-drain capacitance $C_{ds}$ of N-FET 324. At high frequency, these parasitic capacitances may couple a portion of the input signal to the output of LNA 320a.

Figure 3B:
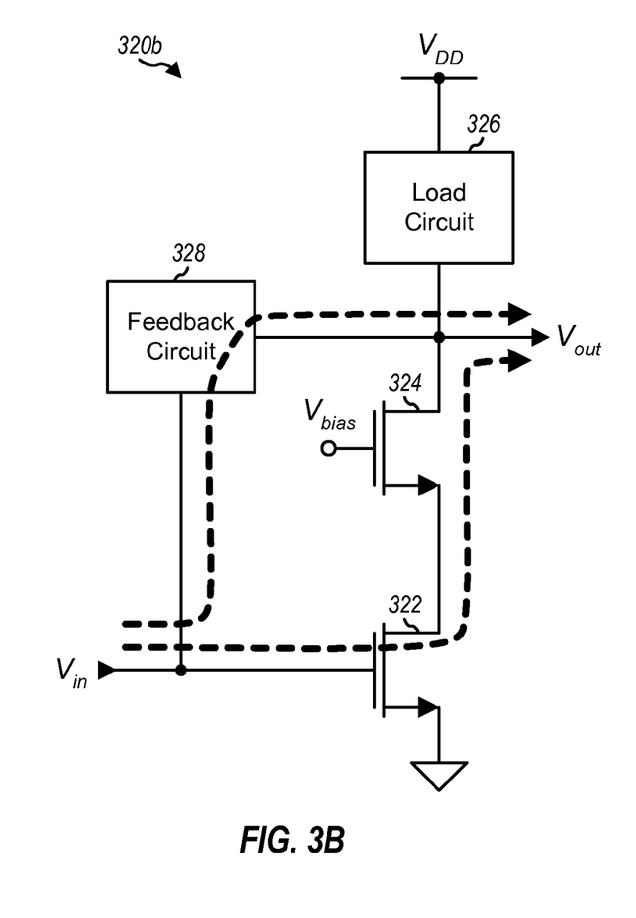

FIG. 3B shows a schematic diagram of an LNA 320b, which may also be used for any one of LNAs 120a through 120c in FIG. 1. LNA 320b includes N-FETs 322 and 324 and load circuit 326 that are coupled as described above for FIG. 3A. LNA 320b further includes a feedback circuit 328 having one end coupled to the gate of N-FET 322 and the other end coupled to the drain of N-FET 324. Feedback circuit 328 may include one or more resistors, inductors, capacitors, transistors, etc. Feedback circuit 328 may improve linearity, reduce gain variability, and/or provide other benefits for LNA 320b.

LNA 320b may be turned off by providing a low bias voltage to the gate of N-FET 322 and/or 324. However, there may be one leakage path through the parasitic capacitances of N-FETs 322 and 324 and another leakage path through feedback circuit 328.

In an aspect, one or more isolation switches may be used in an active circuit such as an LNA to improve isolation between the input and output of the active circuit. An isolation switch may be added within the active circuit and may comprise (i) a shunt switch between an internal node of the active circuit and AC ground and/or (ii) a series switch inserted at an internal node of the active circuit. In general, an active circuit may employ one or more shunt isolation switches and/or one or more series isolation switches.

Figure 4A:
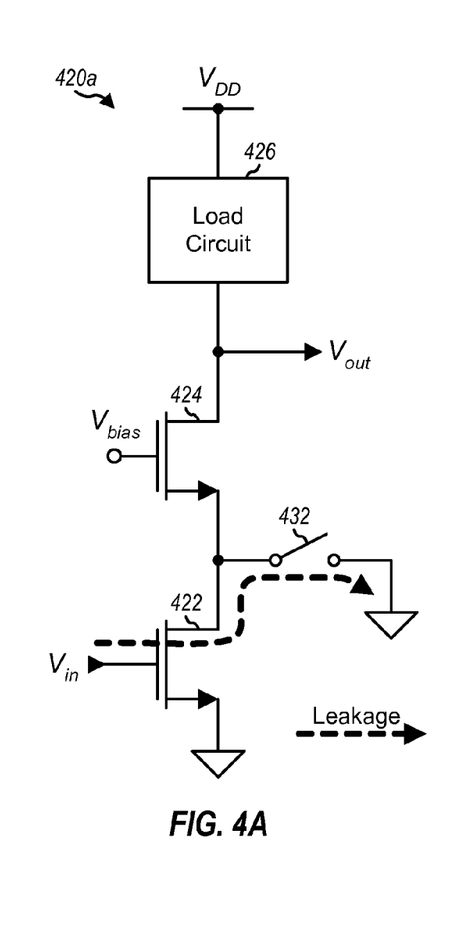
FIG. 4A shows an LNA with a shunt isolation switch.

FIG. 4A shows a schematic diagram of a design of an LNA 420a with a shunt isolation switch. LNA 420a may be used for any one of LNAs 120a through 120c in FIG. 1. LNA 420a includes N-FETs 422 and 424 and a load circuit 426 that are coupled in similar manner as N-FETs 322 and 324 and load circuit 326, respectively, in FIG. 3A. LNA 420a further includes a shunt isolation switch 432 having one end coupled to the drain of N-FET 422 and the other end coupled to circuit ground. Shunt isolation switch 432 may be implemented with one or more N-FETs, P-channel FETs (P-FETs), and/or other circuit components.

Shunt isolation switch 432 may be opened when LNA 420a is turned on to enable operation of LNA 420a. Shunt isolation switch 432 may be closed when LNA 420a is turned off to achieve high isolation. When LNA 420a is turned off, any signal leaking from the input of LNA 420a via the parasitic capacitance of N-FET 422 may be shorted via isolation switch 432 to circuit ground (instead of being routed to the output of the LNA).

Figure 4B:
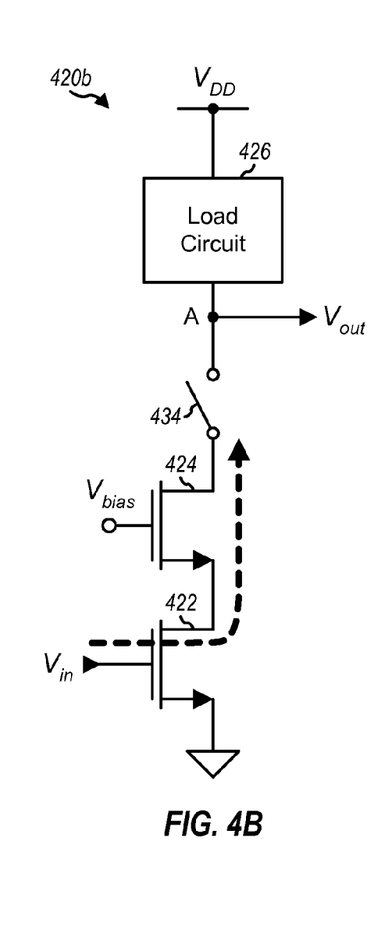
FIG. 4B shows an LNA with a series isolation switch.

FIG. 4B shows a schematic diagram of a design of an LNA 420b with a series isolation switch. LNA 420b may also be used for any one of LNAs 120a through 120c in FIG. 1. LNA 420b includes N-FETs 422 and 424 and load circuit 426 in LNA 420a in FIG. 4A. LNA 420b further includes a series isolation switch 434 that is inserted between the drain of N-FET 424 and node A, which provides the output signal $V_{out}$. Load circuit 426 is coupled between node A and the supply voltage $V_{DD}$.

Series isolation switch 434 may be implemented with one or more N-FETs, P-FETs, etc. Series isolation switch 434 may be closed when LNA 420b is turned on to pass the signal to the output. Series isolation switch 434 may be opened when LNA 420b is turned off to improve isolation.

Figure 4C:
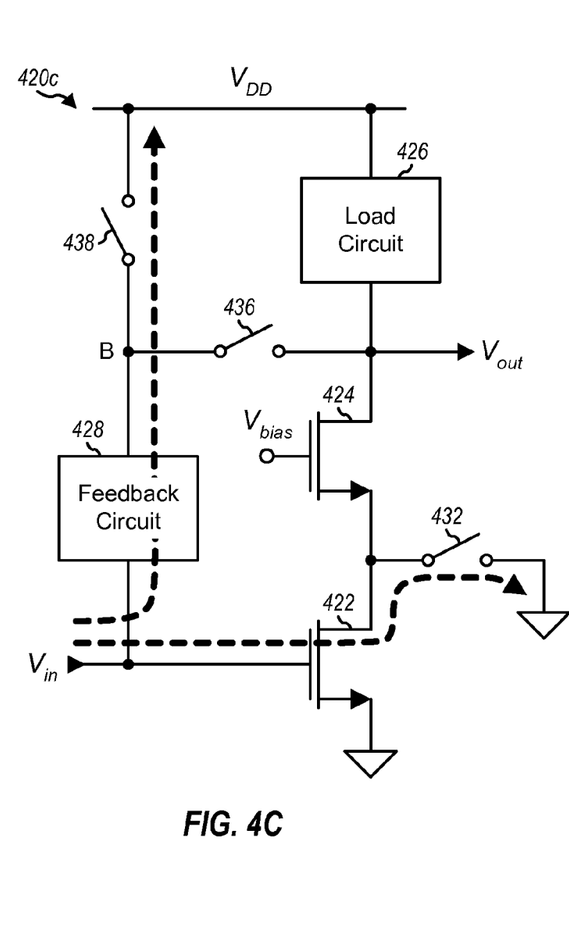
FIG. 4C shows an LNA with feedback and isolation switches.

FIG. 4C shows a schematic diagram of a design of an LNA 420c with feedback and isolation switches. LNA 420c may also be used for any one of LNAs 120a through 120c in FIG. 1. LNA 420c includes N-FETs 422 and 424 and load circuit 426 in LNA 420a in FIG. 4A. LNA 420c further includes a feedback circuit 428, shunt isolation switches 432 and 438, and a series isolation switch 436. Feedback circuit 428 has one end coupled to the gate of N-FET 422 and the other end coupled to node B. Series isolation switch 436 has one end coupled to node B and the other end coupled to the drain of N-FET 424. Shunt isolation switch 438 has one end coupled to node B and the other end coupled to the supply voltage $V_{DD}$. Shunt isolation switch 432 has one end coupled to the drain of N-FET 422 and the other end coupled to circuit ground.

When LNA 420c is turned on, isolation switches 432 and 438 are opened, and isolation switch 436 is closed. When LNA 420c is turned off, isolation switches 432 and 438 are closed, and isolation switch 436 is opened. In this case, any signal leaking from the input of LNA 420c via the parasitic capacitance of N-FET 422 may be shorted via isolation switch 432 to circuit ground. Any signal leaking from the input of LNA 420c via feedback circuit 428 may be shorted via isolation switch 438 to the supply voltage. The supply voltage and circuit ground are both AC ground for high frequency signals. Hence, good isolation may be achieved for LNA 420c when it is turned off, even with the presence of feedback circuit 428.

FIGS. 4A through 4C show three example designs of LNAs with isolation switches. An LNA may also be implemented with other designs. In general, an LNA may include one or more isolation switches, which may comprise shunt and/or series isolation switches that may be located anywhere within the LNA. For simplicity, much of the following description assumes the use of shunt isolation switches.

Figure 5:
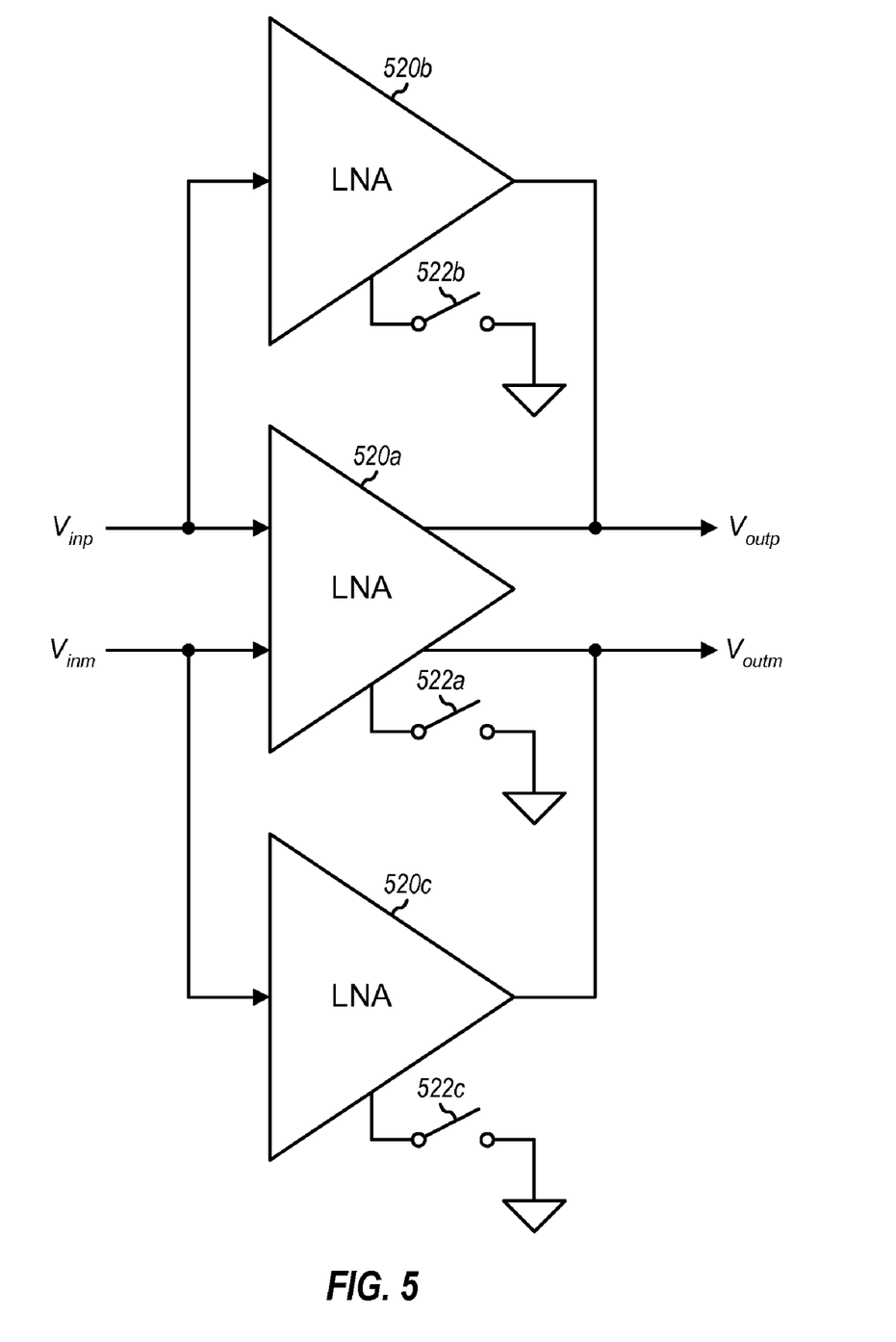
FIG. 5 shows three LNAs with isolation switches and coupled in parallel.

FIG. 5 shows a block diagram of a design of LNAs 520a, 520b and 520c with isolation switches. LNAs 520a, 520b and 520c may be used for LNAs 120a, 120b and 120c, respectively, in FIG. 1. In this design, LNA 520a has an isolation switch 522a coupled between an internal node and circuit ground. LNA 520b has an isolation switch 522b coupled between an internal node and circuit ground. LNA 520c has an isolation switch 522c coupled between an internal node and circuit ground.

If the DVB-H/ISDB-T mode is selected, then LNA 520a may be turned on, LNAs 520b and 520c may be turned off, isolation switch 520a may be opened, and isolation switches 522b and 522c may be closed. The leakage paths through LNAs 520b and 520c may be shorted via isolation switches 522b and 522c. If the high band MediaFLO™ mode is selected, then LNA 520b may be turned on, LNAs 520a and 520c may be turned off, isolation switch 520b may be opened, and isolation switches 522a and 522c may be closed. The leakage paths through LNAs 520a and 520c may be shorted via isolation switches 522a and 522c. If the low band Media-FLO™ mode is selected, then LNA 520c may be turned on, LNAs 520a and 520b may be turned off, isolation switch 520c may be opened, and isolation switches 522a and 522b may be closed. The leakage paths through LNAs 520a and 520b may be shorted via isolation switches 522a and 522b.

In general, any number of LNAs may be coupled in parallel. For an LNA that is turned on, its shunt isolation switch may be opened to pass the desired signal. For an LNA that is turned off, its shunt isolation switch may be closed to short any leakage signal and improve isolation. Data processor 150 or controller/processor 160 may generate a control signal for each isolation switch to open or close that switch.

For simplicity, FIG. 5 shows one shunt isolation switch for each LNA. In general, each of isolation switches 522a, 522b and 522c may comprise one or more shunt and/or series isolation switches.

In FIG. 1, LNAs 120a, 120b and/or 120c may have a relatively wide gain range (e.g., around 50 to 60 decibels (dB) of gain range) in order to handle a wide range of received power for a desired signal as well as potentially large interfering signals (or jammers). Multiple gain modes may be used to support a wide gain range, with each gain mode covering a portion of the entire gain range. For example, six gain modes may be used to support a gain range of 60 dB, with each gain mode covering approximately 10 dB. Adjacent gain modes may overlap to provide continuous gain coverage.

Figure 6:
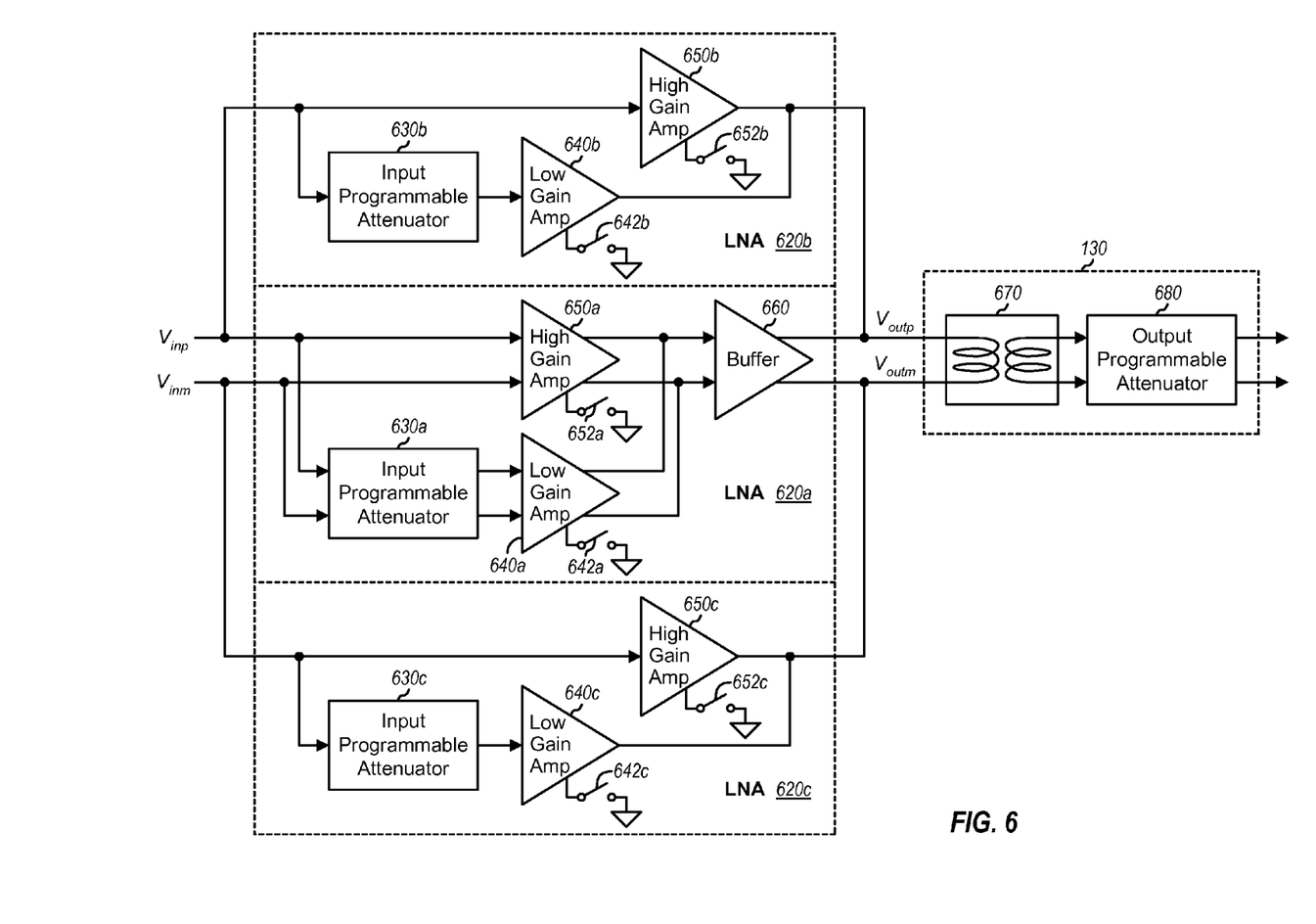
FIG. 6 shows three LNAs with multiple gain modes and isolation switches.

FIG. 6 shows a block diagram of a design of LNAs 620a, 620b and 620c with multiple gain modes and isolation switches. LNAs 620a, 620b and 620c may be used for LNAs 120a, 120b and 120c, respectively, in FIG. 1.

In the design shown in FIG. 6, LNA 620a includes an input programmable attenuator 630a, a low gain amplifier (Amp) 640a, a high gain amplifier 650a, and a buffer 660. If LNA 620a is enabled, then either amplifier 640a or 650a may be selected for use depending the desired gain for LNA 620a. Attenuator 630a attenuates a differential LNA input signal on lines $V_{inp}$ and $V_{inm}$ and provides a differential attenuated signal to amplifier 640a. If enabled, amplifier 640a amplifies its differential input signal with a fixed low gain and provides a differential output signal to buffer 660. If enabled, amplifier 650a amplifies the differential LNA input signal with a fixed high gain and provides a differential output signal to buffer 660. Buffer 660 buffers its differential input signal and provides a differential LNA output signal on lines $V_{outp}$ and $V_{outm}$. An isolation switch 642a may be opened when low gain amplifier 640a is turned on and closed when amplifier 640a is turned off. An isolation switch 652a may be opened when high gain amplifier 650a is turned on and closed when amplifier 650a is turned off.

LNA 620b includes an input programmable attenuator 630b, a low gain amplifier 640b, and a high gain amplifier 650b. If LNA 620b is enabled, then either amplifier 640b or 650b may be selected for use depending the desired gain for LNA 620b. Attenuator 630b attenuates an LNA input signal on line $V_{inp}$ and provides an attenuated signal to amplifier 640b. If enabled, amplifier 640b amplifies its input signal with a fixed low gain and provides an LNA output signal on line $V_{outp}$. If enabled, amplifier 650b amplifies the LNA input signal with a fixed high gain and provides an LNA output signal on line $V_{outp}$. An isolation switch 642b may be opened when low gain amplifier 640b is turned on and closed when amplifier 640b is turned off. An isolation switch 652b may be opened when high gain amplifier 650b is turned on and closed when amplifier 650b is turned off.

LNA 620c includes an input programmable attenuator 630c, amplifiers 640c and 650c, and switches 642c and 652c that are coupled and operated in similar manner as attenuator 630b, amplifiers 640b and 650b, and switches 642b and 652b, respectively, in LNA 620b.

FIG. 6 also shows a design of output stage 130 in FIG. 1. In this design, output stage 130 includes a balun 670 and an output programmable attenuator 680. Balun 670 has two inputs coupled to lines $V_{outp}$ and $V_{outm}$ and two outputs coupled to attenuator 680. Balun 670 performs single-ended to differential conversion of the output signals from LNAs 620b and 620c and may also perform bandpass filtering. Attenuator 680 attenuates the signal from balun 670 and provides a differential output signal for output stage 130. Output stage 130 may also include one or more amplifiers, buffers, filters, etc. Output stage 130 may be considered as an LNA portion that is common to LNAs 620a, 620b and 620c.

In one design, LNA 620a has six gain modes and an overall gain range of approximately 60 dB. High gain amplifier 650a and output programmable attenuator 680 may be used for the three highest gain modes, which may cover a gain range of approximately +24 to −6 dB. Low gain amplifier 640a and input programmable attenuator 630a may be used for the three lowest gain modes, which may cover a gain range of approximately −6 to −36 dB. In general, each of LNAs 620a, 620b and 620c may have any number of gain modes and any overall gain range. The three LNAs may have the same or different number of gain modes, and the same or different overall gain ranges. For each LNA, the low gain amplifier may be biased with less current than the high gain amplifier in order to reduce power consumption.

In the design shown in FIG. 6, attenuator 630 may be used at the front of each LNA 620 to combat large interfering signals. Each attenuator 630 may be implemented with a resistor ladder, a voltage divider network, etc. The use of attenuators 630 and 670 and amplifiers 640 and 650 allows each LNA 620 to achieve a wide gain range. However, the parallel connection of low gain amplifier 640 and high gain amplifier 650 in each LNA 620 may result in a leakage path through each amplifier that is turned off. The leakage signal from high gain amplifier 650 to low gain amplifier 640 may be problematic since the isolation from amplifier 650 to amplifier 640 (without isolation switch 652) may be smaller than the total attenuation of attenuator 630 and amplifier 640. The use of isolation switches 642 and 652 may improve isolation between the high and low gain paths and support multi-gain operation.

FIG. 6 shows an example design of LNAs with multiple gain modes and isolation switches. In general, an LNA may include any number of amplifiers, attenuators, buffers, etc., which may be arranged differently from the configuration shown in FIG. 6. For example, multiple amplifiers may be coupled in cascaded, and each amplifier may be bypassed when not selected. An LNA may also include filters and/or other circuit blocks.

FIG. 6 shows the use of isolation switches for both low gain amplifier 640 and high gain amplifier 650 in each LNA 620. Isolation switch 642 for low gain amplifier 640 may be omitted if the attenuation through attenuator 630 and amplifier 640 can provide sufficient isolation when amplifier 640 is turned off.

Figure 7:
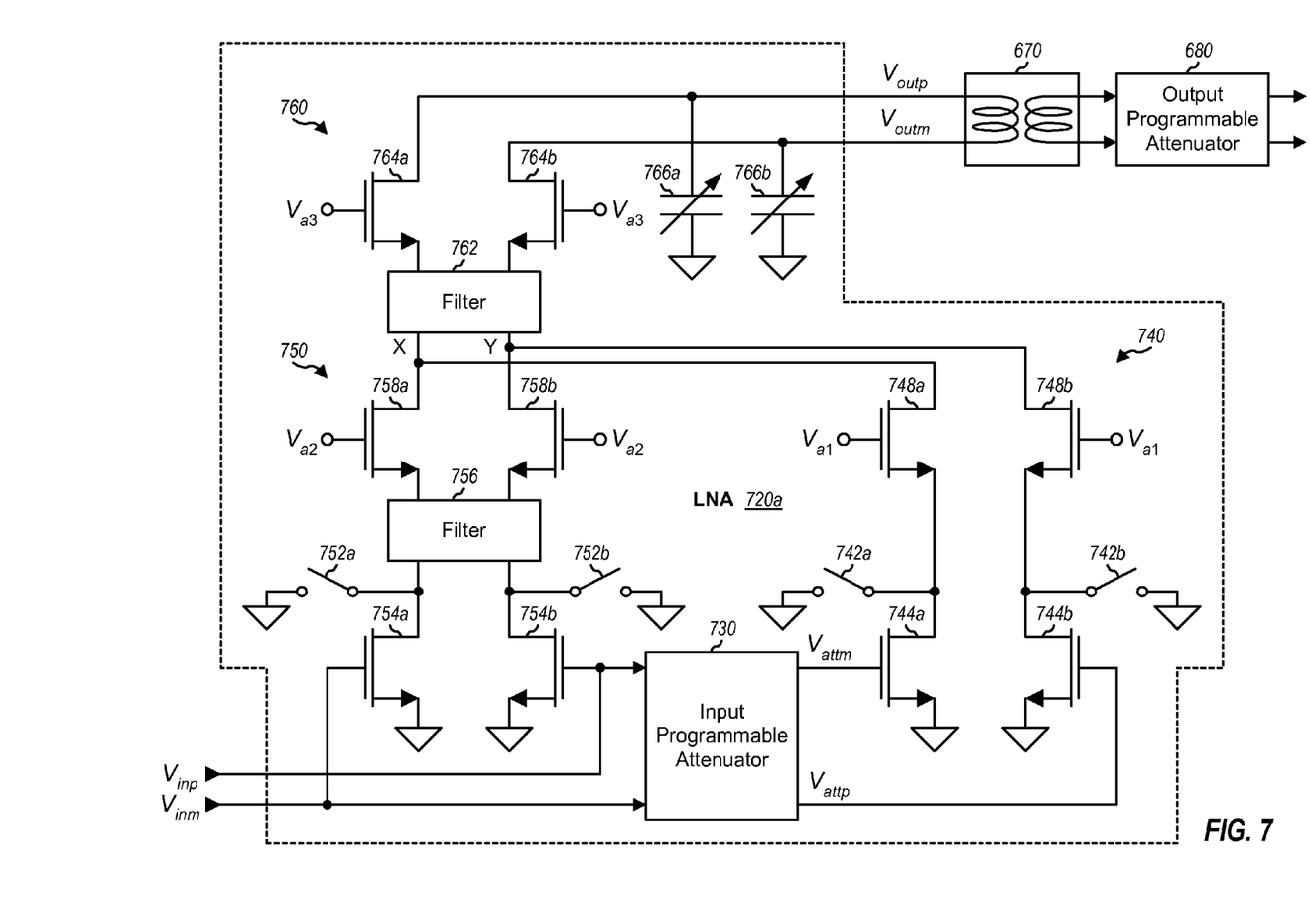
FIG. 7 shows a differential LNA with multiple gain modes and isolation switches.

FIG. 7 shows a schematic diagram of a design of a differential LNA 720a with multiple gain modes and isolation switches. LNA 720a is one design of LNA 620a in FIG. 6 and may be used for LNA 120a in FIG. 1. In this design, LNA 720a includes an input programmable attenuator 730, a low gain section 740, a high gain section 750, and a buffer section 760 that correspond to attenuator 630a, low gain amplifier 640a, high gain amplifier 650a, and buffer 660, respectively, in LNA 620a in FIG. 6. Attenuator 730 receives the differential LNA input signal on lines $V_{inp}$ and $V_{inm}$ and provides a differential attenuated signal on lines $V_{attp}$ and $V_{attm}$.

Low gain section 740 includes a gain stage composed of N-FETs 744a and 744b and a cascode buffer composed of N-FETs 748a and 748b. N-FETs 744a and 744b have their sources coupled to circuit ground and their gates coupled to lines $V_{attm}$ and $V_{attp}$, respectively. N-FETs 748a and 748b have their sources coupled to the drains of N-FETs 744a and 744b, respectively, their gates receiving a bias voltage $V_{a1}$, and their drains coupled to nodes X and Y, respectively. Isolation switches 742a and 742b have one end coupled to the drains of N-FETs 744a and 744b, respectively, and the other end coupled to circuit ground.

High gain section 750 includes a gain stage composed of N-FETs 754a and 754b, a filter 756, and a cascode buffer composed of N-FETs 758a and 758b. N-FETs 754a and 754b have their sources coupled to circuit ground, their gates coupled to lines $V_{inm}$ and $V_{inp}$, respectively, and their drains coupled to a differential input of filter 756. N-FETs 758a and 758b have their sources coupled to a differential output of filter 756, their gates receiving a bias voltage $V_{a2}$, and their drains coupled to nodes X and Y, respectively. Isolation switches 752a and 752b have one end coupled to the drains of N-FETs 754a and 754b, respectively, and the other end coupled to circuit ground.

Buffer section 760 includes a filter 762, a cascode buffer composed of N-FETs 764a and 764b, and capacitors 766a and 766b. Filter 762 has its differential input coupled to nodes X and Y. N-FETs 764a and 764b have their sources coupled to a differential output of filter 762, their gates receiving a bias voltage $V_{a3}$, and their drains coupled to lines $V_{outp}$ and $V_{outm}$, respectively. Capacitor 766a is coupled between line $V_{outp}$ and circuit ground. Capacitor 766b is coupled between line $V_{outm}$ and circuit ground. Capacitors 766a and 766b may be tunable capacitors, as shown in FIG. 7, or fixed capacitors. Capacitors 766a and 766b and balun 670 provide filtering for DVB-H.

When low gain mode is selected for LNA 720a, the N-FETs in high gain section 750 may be turned off, and isolation switches 752a and 752b may be closed to provide good isolation from lines $V_{inp}$ and $V_{inm}$ to nodes X and Y. When high gain mode is selected, the N-FETs in low gain section 740 may be turned off, and isolation switches 742a and 742b may be closed to provide good isolation. Isolation switches 742a and 742b may be omitted if turning off the N-FETs in low gain section 740 can provide sufficient isolation in the high gain mode.

Isolation switches may also be added at other locations within LNA 720a. For example, series isolation switches may be inserted between the drains of N-FETs 754a and 754b and the differential input of filter 756.

Figure 8:
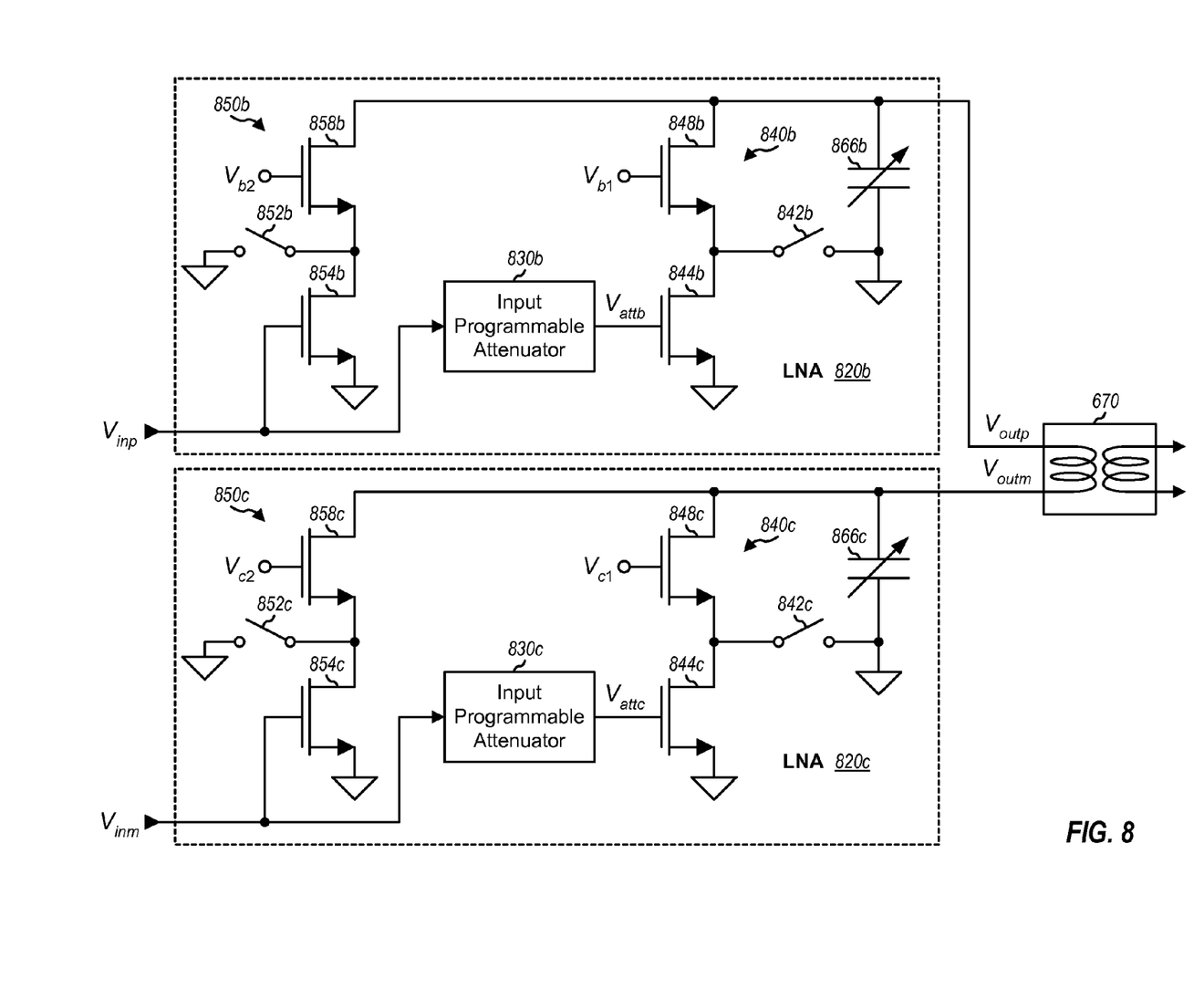
FIG. 8 shows two single-ended LNAs with multiple gain modes and isolation switches.

FIG. 8 shows a schematic diagram of a design of single-ended LNAs 820b and 820c with multiple gain modes and isolation switches. LNAs 820b and 820c are one design of LNAs 620b and 620c, respectively, in FIG. 6 and may be used for LNAs 120b and 120c, respectively, in FIG. 1. In this design, LNA 820b includes an input programmable attenuator 830b, a low gain section 840b, and a high gain section 850b that correspond to attenuator 630b, low gain amplifier 640b, and high gain amplifier 650b, respectively, in LNA 620b in FIG. 6. Attenuator 730b receives the LNA input signal on line $V_{inp}$ and provides an attenuated signal on line $V_{attb}$.

Low gain section 840b includes a gain stage composed of an N-FET 844b and a cascode buffer composed of an N-FET 848b. N-FET 844b has its source coupled to circuit ground and its gate coupled to line $V_{attb}$. N-FETs 848b has its source coupled to the drain of N-FET 844b, its gate receiving a bias voltage $V_{b1}$, and its drain coupled to line $V_{outp}$. An isolation switch 842b has one end coupled to the drain of N-FET 844b and the other end coupled to circuit ground.

High gain section 850b includes a gain stage composed of an N-FET 854b and a cascode buffer composed of an N-FET 858b. N-FET 854b has its source coupled to circuit ground and its gate coupled to line $V_{inp}$. N-FETs 858b has its source coupled to the drain of N-FET 854b, its gate receiving a bias voltage $V_{b2}$, and its drain coupled to line $V_{outp}$. An isolation switch 852b has one end coupled to the drain of N-FET 854b and the other end coupled to circuit ground. A capacitor 866b is coupled between line $V_{outp}$ and circuit ground and may be a tunable capacitor, as shown in FIG. 8, or a fixed capacitor. Capacitor 866b and balun 670 provide filtering for high band MediaFLO™.

LNA 820c includes an input programmable attenuator 830c, a low gain section 840c, and a high gain section 850c that correspond to attenuator 630c, low gain amplifier 640c, and high gain amplifier 650c, respectively, in LNA 620c in FIG. 6. Attenuator 830c and gain sections 840c and 850c are implemented in similar manner as attenuator 830b and gain section 840b and 850b, respectively, in LNA 820b. The gate of an N-FET 854c within LNA 820c is coupled to line $V_{inm}$, and the drains of N-FETs 848c and 858c are coupled to line $V_{outm}$. A capacitor 866c is coupled between line $V_{outm}$ and circuit ground and may be a tunable capacitor, as shown in FIG. 8, or a fixed capacitor. Capacitor 866c and balun 670 provide filtering for low band MediaFLO™.

When low gain mode is selected for LNA 820b, the N-FETs in high gain section 850b may be turned off, and isolation switch 852b may be closed to provide good isolation from line $V_{inp}$ to line $V_{outp}$. When high gain mode is selected, the N-FETs in low gain section 840b may be turned off, and isolation switch 842b may be closed to provide good isolation. Isolation switch 842b may be omitted if turning of the N-FETs in low gain section 840b can provide sufficient isolation in the high gain mode. LNA 820c may be operated in similar manner as LNA 820b.

Isolation switches may also be added at other locations within LNAs 820b and 820c. For example, series isolation switch may be inserted between the drain of N-FET 854b and the source of N-FET 858b.

FIG. 7 shows LNA 720a with filters for the high gain section and FIG. 8 shows LNAs 820b and 820c without any filters. In general, an LNA may or may not include filters, depending on system requirements and/or other considerations. An LNA may also include any number of filters, and each filter may be implemented with various designs and may be of any order. For example, a filter may be a Butterworth filter, an elliptical filter, etc.

The LNA designs shown in FIGS. 7 and 8 use gain stages composed of stacked N-FETs without feedback, which correspond generally to the LNA design shown in FIG. 4A. The gain stages may also be implemented with feedback, e.g., as shown in FIG. 4C. For example, to implement feedback in LNA 820b in FIG. 8, N-FETs 854b and 858b and isolation switch 852b may be replaced with N-FETs 422 and 424, feedback circuit 428, and isolation switches 432, 436 and 436 shown in FIG. 4C.

The isolation switches may be implemented in various manners and with various circuit components. To simplify design, the isolation switches may be implemented with the same type of transistors used for the LNA.

Figure 9A:
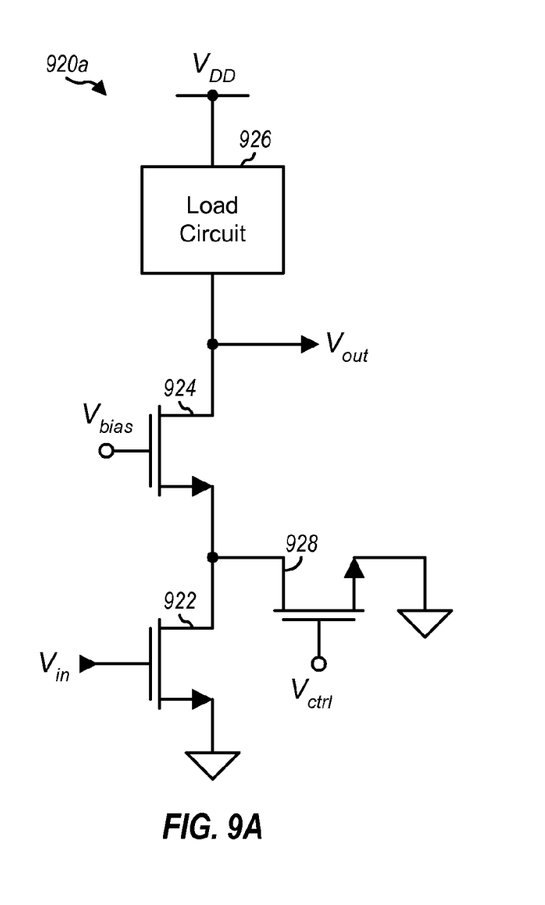
FIGS. 9A and 9B show two designs of an isolation switch.

FIG. 9A shows a schematic diagram of a design of an LNA 920a with an isolation switch. LNA 920a includes N-FETs 922 and 924 and a load circuit 926 that are coupled in similar manner as N-FETs 422 and 424 and load circuit 426 within LNA 420a in FIG. 4A. LNA 920a further includes an isolation switch that is implemented with an N-FET 928. N-FET 928 has its source coupled to circuit ground, its gate receiving a control signal $V_{ctrl}$ and its drain coupled to the drain of N-FET 922. The isolation switch may be closed by applying logic high on $V_{ctrl}$ or opened by applying logic low on $V_{ctrl}$.

Figure 9B:
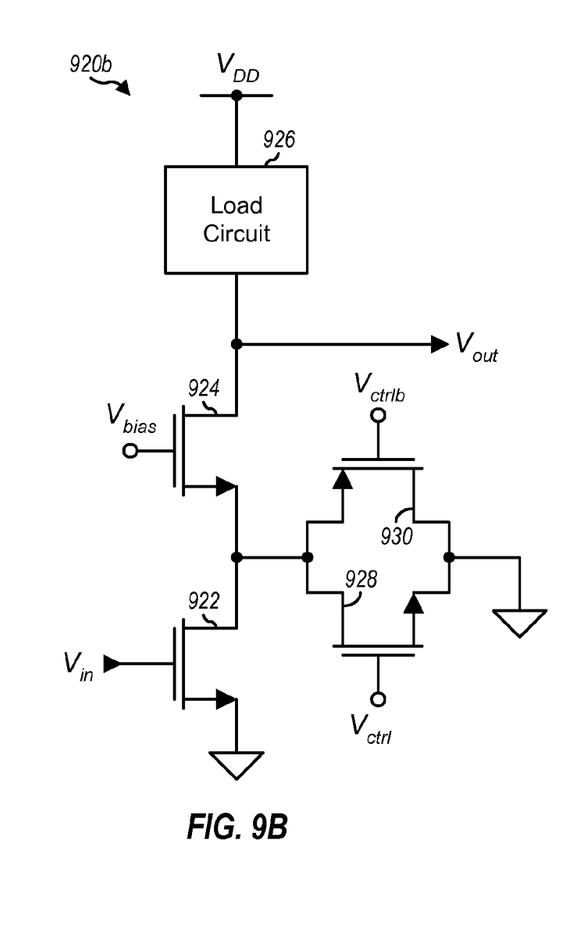

FIG. 9B shows a schematic diagram of a design of an LNA 920b with an isolation switch. LNA 920b includes N-FETs 922 and 924, load circuit 926, and an isolation switch that is implemented with N-FET 928 and a P-FET 930. N-FET 928 is coupled as described above for FIG. 9A. P-FET 930 has its source coupled to the drain of N-FET 922, its gate receiving a complementary control signal $V_{ctrlb}$, and its drain coupled to circuit ground. The isolation switch may be (i) closed by applying logic high on $V_{ctrl}$ and logic low on $V_{ctrlb}$ or (ii) opened by applying logic low on $V_{ctrl}$ and logic high on $V_{ctlb}$.

The use of isolation switches for multiple LNAs coupled in parallel has been described above. In general, isolation switches may be used for any set of signals paths coupled in parallel. These signal paths may be at RF, as described above, or at other frequencies. Each signal path may include any number and any type of circuits. Isolation between the parallel signal paths may be improved by (i) shorting leakage signals in unselected signal paths to AC ground with shunt isolation switches and/or (ii) blocking the leakage signals in the unselected signal paths with series isolation switches. The improved isolation with the use of isolation switches may avoid degradation of receiver performance.

The isolation switches may be used for various active circuits such as different types of amplifiers, mixers, buffers, active filters, etc. The active circuits with isolation switches may be used for various applications such as communication, networking, computing, consumer electronics, etc. These active circuits may be used for broadcast receivers, cellular phones, PDAs, wireless devices, handheld devices, wireless modems, laptop computers, cordless phones, etc. These active circuits may also be used for various communication systems such as CDMA2000 systems, Wideband-CDMA (W-CDMA) systems, Global System for Mobile Communications (GSM) systems, WLANs, broadcast systems, etc. The active circuits may also be used for Bluetooth devices, Global Positioning System (GPS) receivers, etc.

In general, an apparatus may include first and second active circuits coupled in parallel, e.g., connected at their inputs and/or their outputs. The first active circuit may receive a first input signal and provide a first output signal. The second active circuit may receive a second input signal and provide a second output signal. The first active circuit may have a first switch configured to isolate the first active circuit when this circuit is turned off. The second active circuit may have a second switch configured to isolate the second active circuit when this circuit is turned off. Each active circuit may comprise an amplifier, a mixer, a buffer, an active filter, etc., or a combination thereof. More than two active circuits may also be coupled in parallel and may have switches to improve isolation.

In one design, an apparatus may include first and second amplifiers coupled in parallel, e.g., connected at their inputs and/or their outputs. The first amplifier may receive a first input signal and provide a first output signal. The second amplifier may receive a second input signal and provide a second output signal. The first amplifier may have a first switch configured to isolate the first amplifier when this amplifier is turned off. The second amplifier may have a second switch configured to isolate the second amplifier when this amplifier is turned off.

The first and second amplifiers may be LNAs in a receiver. For example, the first amplifier may be a differential LNA (e.g., LNA 120a in FIG. 1), and the second amplifier may be a single-ended LNA (e.g., LNA 120b). The differential LNA may be coupled to first and second input lines (e.g., lines $V_{inp}$ and $V_{inm}$) and first and second output lines (e.g., lines $V_{outp}$ and $V_{outm}$). The single-ended LNA may be coupled to the first input line (e.g., line $V_{inp}$) and the first output line (e.g., line $V_{outp}$).

The apparatus may further include a third amplifier coupled in parallel with the first and/or second amplifier. The third amplifier may receive a third input signal and provide a third output signal. The third amplifier may have a third switch configured to isolate the third amplifier when this amplifier is turned off. The third amplifier may be a single-ended LNA and may be coupled to the second input line (e.g., line $V_{inm}$) and the second output line (e.g., line $V_{outm}$).

Alternatively, the first amplifier may be a high gain amplifier (e.g., amplifier 650a in FIG. 6), and the second amplifier may be a low gain amplifier (e.g., amplifier 640a). The apparatus may further include an attenuator (e.g., attenuator 630a) coupled to the low gain amplifier. The attenuator may receive the first input signal for the first/high gain amplifier and provide the second input signal for the second/low gain amplifier.

A switch for an amplifier may comprise a shunt switch coupled between an internal node of the amplifier and AC ground, e.g., circuit ground or a supply voltage. The shunt switch may be closed when the amplifier is turned off and may be opened when the amplifier is turned on. Alternatively or additionally, the switch for the amplifier may comprise a series switch that is inserted at an internal node of the amplifier.

An amplifier may include first and second FETs. The first FET (e.g., N-FET 422 in FIG. 4A, 4B or 4C) may have a gate that receives an input signal for the amplifier. The second FET (e.g., N-FET 424) may have a drain that provides an output signal for the amplifier and a source that is coupled to a drain of the first FET. In general, each FET may be an N-FET, a P-FET, or some other type of transistor. A switch may be coupled to the drain of the first FET and AC ground and may be implemented with a FET (e.g., N-FET 928 in FIG. 9A). The amplifier may further include a feedback circuit (e.g., feedback circuit 428 in FIG. 4C) coupled between the gate of the first FET and the drain of the second FET. A switch (e.g., switch 438) may be coupled between the drain of the second FET and AC ground. A switch (e.g., switch 436) may be coupled between the feedback circuit and the gate of the first FET.

The first and second amplifiers may be for first and second communication systems, respectively, first and second frequency bands, respectively, and/or first and second gain ranges, respectively. For example, the first amplifier may amplify a DVB-H signal, and the second amplifier may amplify a MediaFLO™ signal.

The active circuits with isolation switches described herein may be implemented within an IC, an RFIC, a mixed-signal IC, an ASIC, a printed circuit board (PCB), an electronics device, etc. These active circuits may also be fabricated with various IC process technologies such as complementary metal oxide semiconductor (CMOS), N-channel MOS (N-MOS), P-channel MOS (P-MOS), bipolar junction transistor (BJT), bipolar-CMOS (BiCMOS), silicon germanium (SiGe), gallium arsenide (GaAs), etc.

An apparatus implementing the active circuits with isolation switches described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a first active circuit configured to receive a first input signal and provide a first output signal, the first active circuit comprising a first switch configured to isolate the first active circuit when turned off; and
   a second active circuit coupled in parallel with the first active circuit and configured to receive a second input signal and provide a second output signal, wherein the first active circuit receives a differential input and the second active circuit receives a single-ended input.

2. The apparatus of claim 1, wherein the second active circuit comprises a second switch configured to isolate the second active circuit when turned off.

3. The apparatus of claim 1, wherein the first switch comprises a shunt switch coupled between an internal node of the first active circuit and alternating current (AC) ground.

4. The apparatus of claim 1, wherein the first active circuit comprises at least one of an amplifier, a mixer, a buffer, and an active filter.

5. An apparatus comprising:
   a first amplifier configured to receive a first input signal and provide a first output signal, the first amplifier comprising a first switch configured to isolate the first amplifier when turned off; and
   a second amplifier coupled in parallel with the first amplifier and configured to receive a second input signal and provide a second output signal, wherein the first amplifier is a differential low noise amplifier (LNA) and the second amplifier is a first single-ended LNA.

6. The apparatus of claim 5, wherein the second amplifier comprises a second switch configured to isolate the second amplifier when turned off.

7. The apparatus of claim 6, further comprising:
   a third amplifier coupled in parallel with the second amplifier and configured to receive a third input signal and provide a third output signal, the third amplifier comprising a third switch configured to isolate the third amplifier when turned off.

8. The apparatus of claim 5, wherein the first and second amplifiers are in a receiver.

9. The apparatus of claim 5, wherein the differential low noise amplifier (LNA) is coupled to first and second input lines and first and second output lines, and wherein the first single-ended LNA is coupled to the first input line and the first output line.

10. The apparatus of claim 7, wherein the third amplifier is a second single-ended low noise amplifier (LNA).

11. The apparatus of claim 10, wherein the differential low noise amplifier (LNA) is coupled to first and second input lines and first and second output lines, wherein the first single-ended LNA is coupled to the first input line and the first output line, and wherein the second single-ended LNA is coupled to the second input line and the second output line.

12. The apparatus of claim 5, wherein the first amplifier is a high gain amplifier and the second amplifier is a low gain amplifier.

13. The apparatus of claim 12, further comprising:
   an attenuator coupled to the low gain amplifier and configured to receive the first input signal and provide the second input signal for the low gain amplifier.

14. The apparatus of claim 5, wherein the first switch comprises a shunt switch coupled between an internal node of the first amplifier and alternating current (AC) ground.

15. The apparatus of claim 14, wherein the shunt switch is closed when the first amplifier is turned off and is opened when the first amplifier is turned on.

16. The apparatus of claim 5, wherein the first switch comprises a series switch inserted at an internal node of the first amplifier.

17. The apparatus of claim 5, wherein the first amplifier comprises
   a first transistor configured to receive the first input signal, and
   a second transistor coupled to the first transistor and configured to provide the first output signal, and
   wherein the first switch is coupled to the first transistor and alternating current (AC) ground.

18. The apparatus of claim 5, wherein the first amplifier comprises
   a first field effect transistor (FET) having a gate receiving the first input signal, and
   a second FET having a drain providing the first output signal and a source coupled to a drain of the first FET, and
   wherein the first switch is coupled to the drain of the first FET and alternating current (AC) ground.

19. The apparatus of claim 18, wherein the first switch comprises a third field effect transistor (FET) having a drain coupled to the drain of the first FET and a source coupled to alternating current (AC) ground.

20. The apparatus of claim 18, wherein the first amplifier further comprises
   a feedback circuit coupled between the gate of the first field effect transistor (FET) and the drain of the second FET.

21. The apparatus of claim 20, wherein the first amplifier further comprises
   a second switch coupled between the feedback circuit and alternating current (AC) ground.

22. The apparatus of claim 20, wherein the first amplifier further comprises
a second switch coupled in series with the feedback circuit.

23. The apparatus of claim 5, wherein the first and second amplifiers are for first and second communication systems, respectively.

24. The apparatus of claim 5, wherein the first amplifier is configured to amplify a Digital Video Broadcasting for Handhelds (DVB-H) signal, and wherein the second amplifier is configured to amplify a MediaFLO™ signal.

25. The apparatus of claim 5, wherein the first and second amplifiers are for first and second frequency bands, respectively.

26. The apparatus of claim 5, wherein the first and second amplifiers are for first and second gain ranges, respectively.

27. An integrated circuit comprising:
a first amplifier configured to receive a first input signal and provide a first output signal, the first amplifier comprising a first switch configured to isolate the first amplifier when turned off; and
a second amplifier coupled in parallel with the first amplifier and configured to receive a second input signal and provide a second output signal, wherein the first amplifier is a differential low noise amplifier (LNA) and the second amplifier is a single-ended LNA.

28. The integrated circuit of claim 27, wherein the second amplifier comprises a second switch configured to isolate the second amplifier when turned off.

29. The integrated circuit of claim 28, further comprising:
a third amplifier coupled in parallel with the second amplifier and configured to receive a third input signal and provide a third output signal, the third amplifier comprising a third switch configured to isolate the third amplifier when turned off.

30. A method comprising:
turning on a differential amplifier among multiple single-ended amplifiers coupled in parallel;
turning off remaining ones of the multiple single-ended amplifiers; and
activating at least one switch for at least one single-ended amplifier among the remaining ones of the multiple single-ended amplifiers to isolate the at least one single-ended amplifier when turned off.

31. The method of claim 30, wherein the activating the at least one switch comprises
closing the at least one switch coupled between internal node of the at least one single-ended amplifier and alternating current (AC) ground.

32. The method of claim 30, further comprising:
opening a switch for the differential amplifier that is turned on.

33. An apparatus comprising:
means for turning on a differential amplifier among multiple single-ended amplifiers coupled in parallel;
means for turning off remaining ones of the multiple single-ended amplifiers; and
means for activating at least one switch for at least one single-ended amplifier among the remaining ones of the multiple single-ended amplifiers to isolate the at least one single-ended amplifier when turned off.

34. The apparatus of claim 33, wherein the means for activating the at least one switch comprises
means for closing the at least one switch coupled between internal node of the at least one single-ended amplifier and alternating current (AC) ground.

35. The apparatus of claim 33, further comprising:
means for opening a switch for the differential amplifier that is turned on.

* * * * *